(12) United States Patent
Yuda et al.

(10) Patent No.: US 10,971,634 B2
(45) Date of Patent: Apr. 6, 2021

(54) OXIDE SEMICONDUCTOR DEVICE AND METHOD OF MANUFACTURING OXIDE SEMICONDUCTOR DEVICE

(71) Applicant: Mitsubishi Electric Corporation, Tokyo (JP)

(72) Inventors: Yohei Yuda, Tokyo (JP); Tatsuro Watahiki, Tokyo (JP); Akihiko Furukawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/617,526

(22) PCT Filed: Jun. 8, 2018

(86) PCT No.: PCT/JP2018/022020
§ 371 (c)(1),
(2) Date: Nov. 27, 2019

(87) PCT Pub. No.: WO2019/003861
PCT Pub. Date: Jan. 3, 2019

(65) Prior Publication Data
US 2020/0185541 A1    Jun. 11, 2020

(30) Foreign Application Priority Data
Jun. 29, 2017   (JP) .............................. JP2017-126931

(51) Int. Cl.
*H01L 29/872*   (2006.01)
*H01L 21/02*   (2006.01)
(Continued)

(52) U.S. Cl.
CPC ...... *H01L 29/872* (2013.01); *H01L 21/02414* (2013.01); *H01L 21/02565* (2013.01);
(Continued)

(58) Field of Classification Search
None
See application file for complete search history.

(56) References Cited

U.S. PATENT DOCUMENTS

| 2012/0267748 A1 | 10/2012 | Suzuki |
| 2015/0144965 A1 | 5/2015 | Tsuji et al. |
| | (Continued) | |

FOREIGN PATENT DOCUMENTS

| JP | 2012-227429 A | 11/2012 |
| JP | 2013-251406 A | 12/2013 |
| | (Continued) | |

OTHER PUBLICATIONS

International Search Report and Written Opinion dated Aug. 28, 2018 for PCT/JP2018/022020 filed on Jun. 8, 2018, 9 pages including English Translation of the International Search Report.

*Primary Examiner* — Asok K Sarkar
(74) *Attorney, Agent, or Firm* — Xsensus LLP

(57) ABSTRACT

An oxide semiconductor device has an improved withstand voltage when an inverse voltage is applied, while suppressing diffusion of different types of materials to a Schottky interface. The oxide semiconductor device includes an n-type gallium oxide epitaxial layer, p-type oxide semiconductor layers of an oxide that is a different material from the material for the gallium oxide epitaxial layer, a dielectric layer formed to cover at least part of a side surface of the oxide semiconductor layer, an anode electrode, and a cathode electrode. Hetero pn junctions are formed between the lower surfaces of the oxide semiconductor layers and a gallium oxide substrate or between the lower surfaces of the oxide semiconductor layers and the gallium oxide epitaxial layer.

13 Claims, 7 Drawing Sheets

(51) Int. Cl.
*H01L 21/441* (2006.01)
*H01L 29/24* (2006.01)
*H01L 29/36* (2006.01)
*H01L 29/40* (2006.01)
*H01L 29/45* (2006.01)
*H01L 29/47* (2006.01)
*H01L 29/66* (2006.01)

(52) U.S. Cl.
CPC ............ *H01L 21/441* (2013.01); *H01L 29/24* (2013.01); *H01L 29/36* (2013.01); *H01L 29/405* (2013.01); *H01L 29/45* (2013.01); *H01L 29/47* (2013.01); *H01L 29/66969* (2013.01)

(56) References Cited

U.S. PATENT DOCUMENTS

| | | |
|---|---|---|
| 2016/0005884 A1 | 1/2016 | Aketa et al. |
| 2016/0043238 A1* | 2/2016 | Takizawa .......... H01L 21/02433 257/43 |
| 2017/0213918 A1* | 7/2017 | Sasaki .................... C30B 23/025 |
| 2018/0315820 A1* | 11/2018 | Kub .................... H01L 29/7828 |
| 2019/0363197 A1* | 11/2019 | Sasaki ............... H01L 21/02057 |
| 2020/0058804 A1* | 2/2020 | Hirabayashi ............ H01L 29/24 |
| 2020/0111882 A1* | 4/2020 | Hirabayashi ............ H01L 21/78 |
| 2020/0144376 A1* | 5/2020 | Hitora ................. H01L 29/8083 |

FOREIGN PATENT DOCUMENTS

| | | |
|---|---|---|
| JP | 2014-127573 A | 7/2014 |
| JP | 2015-115373 A | 6/2015 |
| JP | 2016-178336 A | 10/2016 |

* cited by examiner

F I G . 3
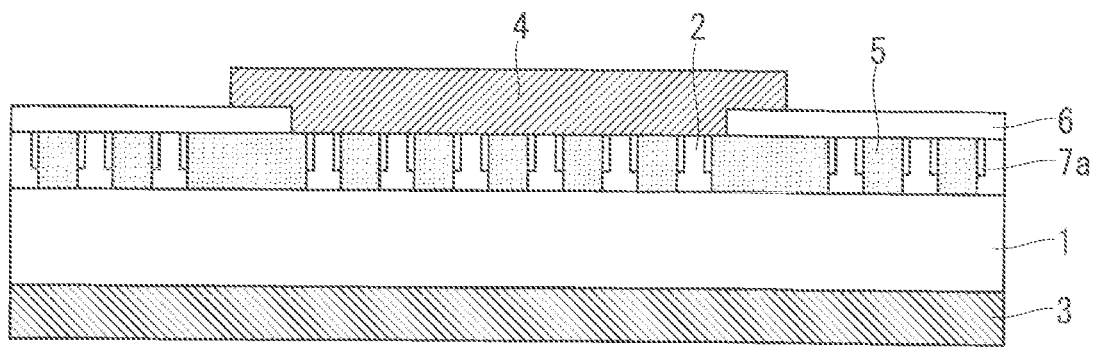
F I G . 4
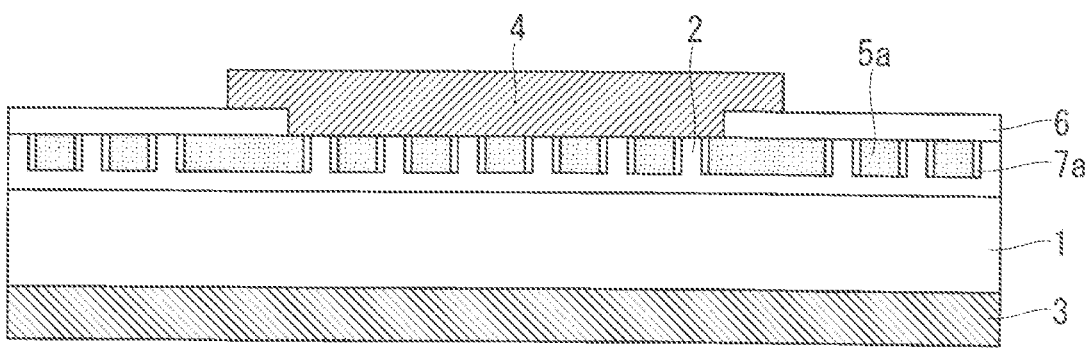
F I G . 5
F I G . 6
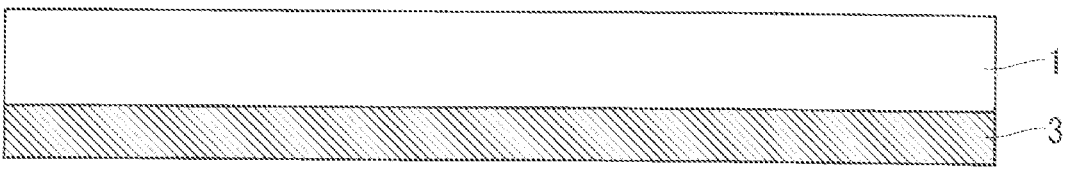

F I G . 1 1
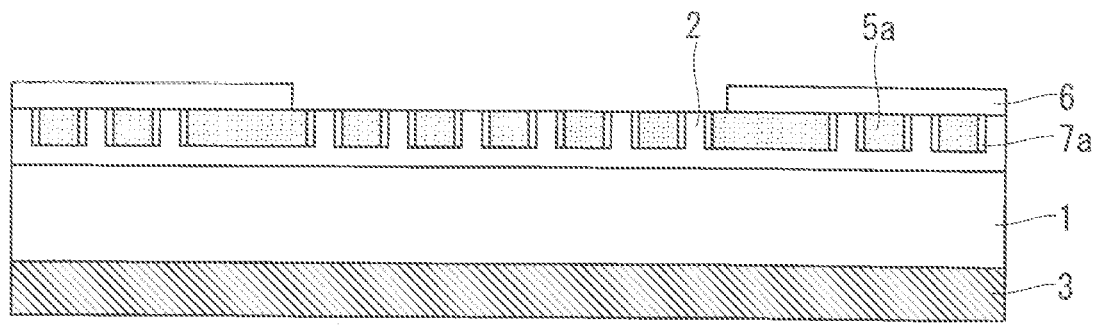
F I G . 1 2
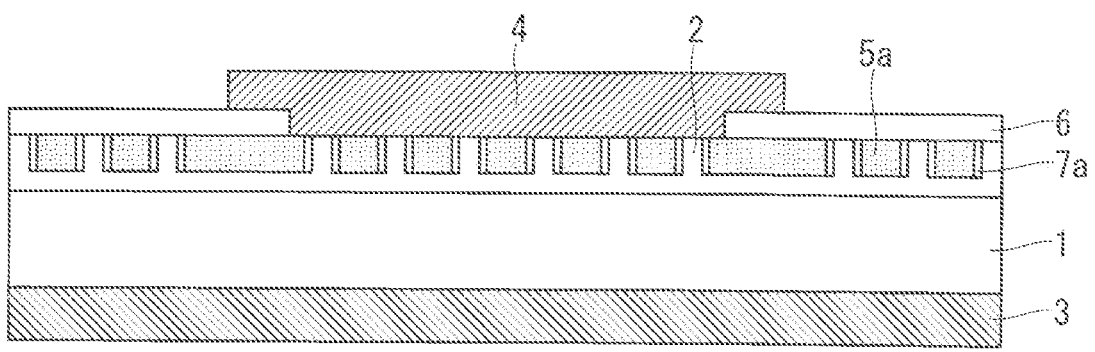
F I G . 1 3
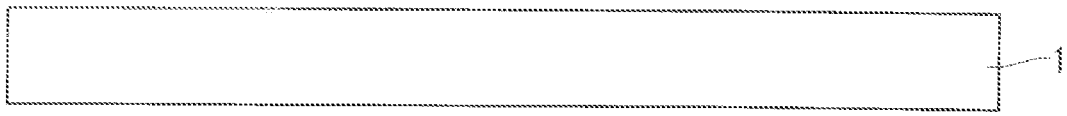
F I G . 1 4

F I G . 1 5
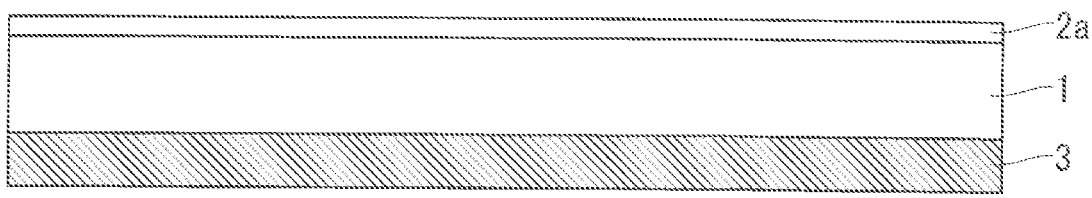
F I G . 1 6
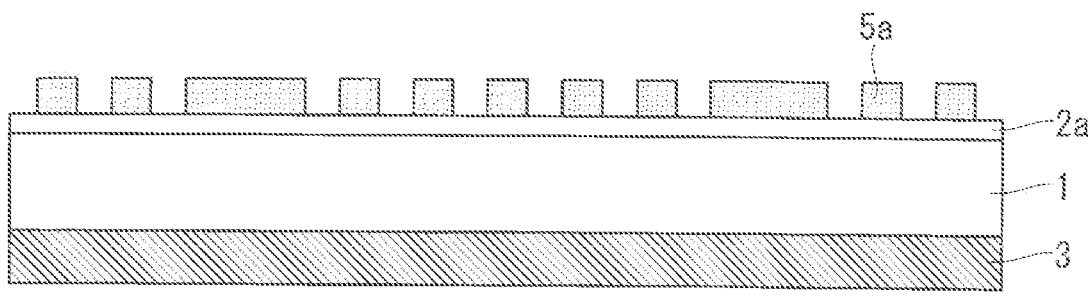
F I G . 1 7
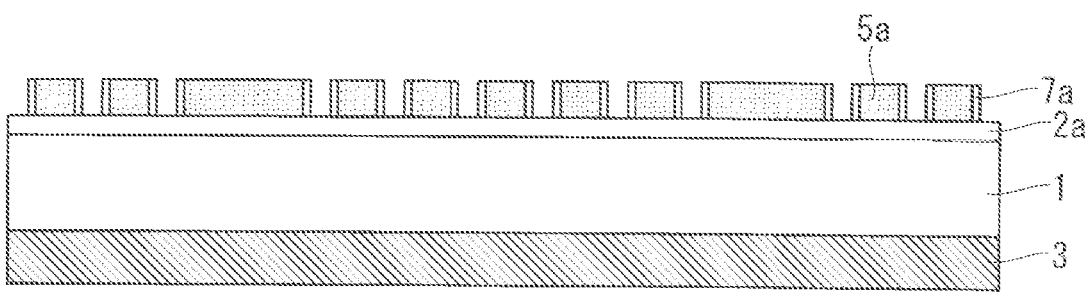
F I G . 1 8
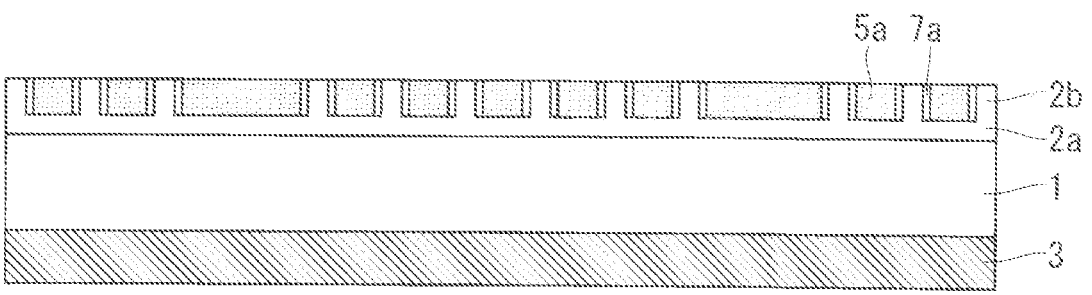

F I G . 2 2
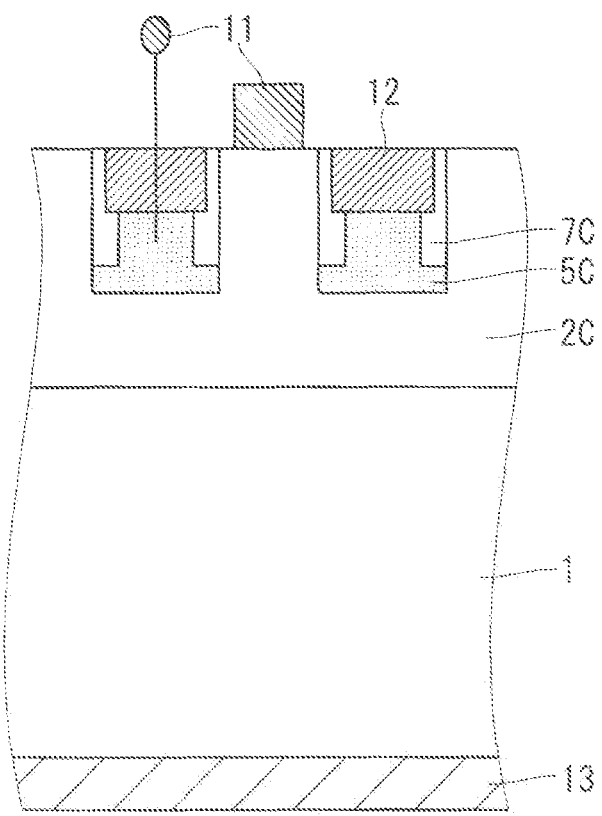

OXIDE SEMICONDUCTOR DEVICE AND METHOD OF MANUFACTURING OXIDE SEMICONDUCTOR DEVICE

CROSS-REFERENCE TO RELATED APPLICATION

The present application is based on PCT filing PCT/JP2018/022020, filed Jun. 8, 2018, which claims priority to JP 2017-126931, filed Jun. 29, 2017, the entire contents of each are incorporated herein by reference.

TECHNICAL FIELD

A technique disclosed in the specification of the present application relates to an oxide semiconductor device and a method of manufacturing the oxide semiconductor device.

BACKGROUND ART

Power electronics (abbreviated as PE) is a technology for speedy and efficient conversion of electricity such as direct current, alternating current, and frequencies of current, and it is a term used to describe a technology that mixes electronic engineering and control engineering, which are based on semiconductors in recent years, with conventional power engineering.

Nowadays PE is a technology applied in almost all or all fields using electricity, such as for power use, for industrial use, for transport use, and for household use.

In recent years, the ratio of electric energy to total energy consumption, i.e., an electrification rate, is continuing its upward trend not only in Japan but also on a worldwide basis. One of the backgrounds for this is recent year's development of equipment excellent in convenience and energy saving in terms of electricity usage, and resultant improvement in the utilization ratio of electricity. A PE technology forms the foundations for this.

The PE technology can also be said as a technology for converting electricity to a form suited for equipment using electricity, irrespective of the form of electricity to be converted (e.g., frequencies or the magnitude of current or voltage). The base elements of the PE technology are rectifiers and inverters. Then, semiconductors and semiconductor elements such as diodes and transistors that apply semiconductors form the foundations for the rectifiers and inverters.

In today's PE fields, diodes serving as semiconductor rectifying devices are used in various applications including electrical equipment. The diodes are applied in a wide range of frequency bands.

In recent years, switching elements capable of operating with low losses and at high frequencies in applications that require high withstand voltage and large capacity have been developed and put to practical use. Also, materials used for the switching elements have shifted to wide-gap materials to increase the withstand voltages of the elements.

Schottky barrier diodes (i.e., SBDs) or pn diodes (PNDs) represent such switching elements, and these diodes are widely used in various applications.

For example, semiconductor devices having a merged P-i-n/Schottky diode (MPS) structure that includes both Schottky junctions and pn junctions have been developed as illustrated in Patent Document 1.

Compared to the case of using SBDs alone, the MPS structure can pass a large surge current that exceeds a rating, with a small voltage drop as a result of bipolar operations of PNDs. Thus, the MPS structure has an improved forward withstand surge voltage. In this way, development has been made on semiconductor devices that have a rectifying function of suppressing an increase in forward voltage drop and achieving a high forward withstand surge voltage.

Moreover, as illustrated in Patent Document 2, electric field concentrations in the bottoms of trenches can be moderated by a depletion layer generated from a pn junction portion at the interface between a terminal structure and a drift layer. In this way, development has been made on semiconductor devices that are capable of reducing its forward voltage and reverse leakage current and thereby easily achieving rectifying operations.

PRIOR ART DOCUMENTS

Patent Documents

Patent Document 1: Japanese Patent Application Laid-Open No. 2012-227429
Patent Document 2: Japanese Patent Application Laid-Open No. 2014-127573

SUMMARY

Problem to be Solved by the Invention

In the semiconductor device illustrated in Patent Document 1, grooves are formed between pn materials that configure the MPS structure, the grooves reaching a depth below the interface between the pn materials. This configuration can suppress an increase in forward voltage drop, but on the other hand, has a problem in that the withstand voltage decreases when an inverse voltage is applied.

In the semiconductor device using SiC illustrated in Patent Document 2, pn junctions are assumed to be formed of the same material, and it is not envisaged that an oxide is used as a material for the semiconductor layer. In the case of using an oxide material, it is necessary to prevent diffusion of metal atoms or other atoms to the Schottky interface. There is also a problem in that no sufficient measures are taken to prevent the p-type oxide semiconductor from losing its p-type conductivity due to oxidation.

The technique disclosed in the specification of the present application has been made in order to solve problems as described above, and it is an object of the present application to provide a technique for improving the withstand voltage of an oxide semiconductor device made of an oxide semiconductor material when an inverse voltage is applied, while suppressing diffusion of different types of materials to a Schottky interface.

Means to Solve the Problem

A first aspect of the technique disclosed in the specification of the present application is an oxide semiconductor device that includes an n-type gallium oxide epitaxial layer formed on an upper surface of an n-type gallium oxide substrate, a p-type oxide semiconductor layer formed from an upper surface of the gallium oxide epitaxial layer to at least an inside of the gallium oxide epitaxial layer, the p-type oxide semiconductor layer being an oxide that is a different material from a material for the gallium oxide epitaxial layer, a dielectric layer formed to cover at least part of a side surface of the oxide semiconductor layer and made of a material having a lower dielectric constant than the material for the oxide semiconductor layer, an anode electrode formed on the upper surface of the gallium oxide epitaxial layer and forming a Schottky junction with the gallium oxide epitaxial layer, and a cathode electrode formed on a lower surface of the gallium oxide substrate and forming an ohmic junction with the gallium oxide substrate. A hetero pn junction is formed between a lower surface of the oxide semiconductor layer and the gallium oxide substrate or between a lower surface of the oxide semiconductor layer and the gallium oxide epitaxial layer.

A second aspect of the technique disclosed in the specification of the present application is an oxide semiconductor device that includes forming a cathode electrode on a lower surface of the gallium oxide substrate, the cathode electrode forming an ohmic junction with an n-type gallium oxide substrate, epitaxially growing an n-type gallium oxide epitaxial layer on an upper surface of the gallium oxide substrate, forming a groove from an upper surface of the gallium oxide epitaxial layer to at least an inside of the gallium oxide epitaxial layer, forming a dielectric layer on at least part of a side surface of the groove, forming a p-type oxide semiconductor layer in the groove in which the dielectric layer has been formed on the side surface, the p-type oxide semiconductor layer being an oxide that is a different material from the gallium oxide epitaxial layer and being made of a material having a higher dielectric constant than the dielectric layer, forming an anode electrode on the upper surface of the gallium oxide epitaxial layer, the anode electrode forming a Schottky junction with the gallium oxide epitaxial layer, and forming a hetero pn junction between a lower surface of the oxide semiconductor layer and the gallium oxide substrate or between the lower surface of the oxide semiconductor layer and the gallium oxide epitaxial layer.

A third aspect of the technique disclosed in the specification of the present application is a method of manufacturing an oxide semiconductor device. The method includes forming a cathode electrode on a lower surface of an n-type gallium oxide substrate, the cathode electrode forming an ohmic junction with the gallium oxide substrate, epitaxially growing an n-type first gallium oxide epitaxial layer on an upper surface of the gallium oxide substrate, forming a p-type oxide semiconductor layer on part of an upper surface of the first gallium oxide epitaxial layer, the p-type oxide semiconductor layer being made of an oxide that is a different material from a material for the first gallium oxide epitaxial layer, forming a dielectric layer on at least part of a side surface of the oxide semiconductor layer, the dielectric layer being made of a material having a lower dielectric constant than the material for the oxide semiconductor layer, epitaxially growing an n-type second gallium oxide epitaxial layer to cover the first gallium oxide epitaxial layer, the oxide semiconductor layer, and the dielectric layer, forming an anode electrode on the upper surface of the second gallium oxide epitaxial layer, the anode electrode forming a Schottky junction with the second gallium oxide epitaxial layer, and forming a hetero pn junction between a lower surface of the oxide semiconductor layer and the upper surface of the first gallium oxide epitaxial layer.

A fourth aspect of the technique disclosed in the specification of the present application is an oxide semiconductor device that includes an n-type gallium oxide epitaxial layer formed on an upper surface of an n-type gallium oxide substrate, a p-type oxide semiconductor layer formed from an upper surface of the gallium oxide epitaxial layer to at least an inside of the gallium oxide epitaxial layer, the p-type oxide semiconductor layer being an oxide that is a different material from a material for the gallium oxide epitaxial layer, a dielectric layer formed to cover at least part of a side surface of the oxide semiconductor layer and made of a material having a lower dielectric constant than the material for the oxide semiconductor layer, a source electrode formed on the upper surface of the gallium oxide epitaxial layer and joined directly to the gallium oxide epitaxial layer and the oxide semiconductor layer, a gate electrode that is in contact with the gallium oxide epitaxial layer and the oxide semiconductor layer via the dielectric layer, and a drain electrode formed on a lower surface of the gallium oxide substrate and joined directly to the gallium oxide substrate. A hetero pn junction is formed between a lower surface of the gallium oxide epitaxial layer and the gallium oxide substrate.

Effects of the Invention

The first aspect of the technique disclosed in the specification of the present application is the oxide semiconductor device that includes an n-type gallium oxide epitaxial layer formed on an upper surface of an n-type gallium oxide substrate, a p-type oxide semiconductor layer formed from an upper surface of the gallium oxide epitaxial layer to at least an inside of the gallium oxide epitaxial layer, the p-type oxide semiconductor layer being an oxide that is a different material from a material for the gallium oxide epitaxial layer, a dielectric layer formed to cover at least part of a side surface of the oxide semiconductor layer and made of a material having a lower dielectric constant than the material for the oxide semiconductor layer, an anode electrode formed on the upper surface of the gallium oxide epitaxial layer and forming a Schottky junction with the gallium oxide epitaxial layer, and a cathode electrode formed on a lower surface of the gallium oxide substrate and forming an ohmic junction with the gallium oxide substrate. A hetero pn junction is formed between a lower surface of the oxide semiconductor layer and the gallium oxide substrate or between a lower surface of the oxide semiconductor layer and the gallium oxide epitaxial layer. With this configuration, the oxide semiconductor device, in which the hetero pn junction is formed of different types of oxide semiconductor materials, can have an improved withstand voltage when an inverse voltage is applied, while suppressing diffusion of different types of materials to a Schottky interface.

The second aspect of the technique disclosed in the specification of the present application is the oxide semiconductor device that includes forming a cathode electrode on a lower surface of the gallium oxide substrate, the cathode electrode forming an ohmic junction with an n-type gallium oxide substrate, epitaxially growing an n-type gallium oxide epitaxial layer on an upper surface of the gallium oxide substrate, forming a groove from an upper surface of the gallium oxide epitaxial layer to at least an inside of the gallium oxide epitaxial layer, forming a dielectric layer on at least part of a side surface of the groove, forming a p-type oxide semiconductor layer in the groove in which the dielectric layer has been formed on the side surface, the p-type oxide semiconductor layer being an oxide that is a different material from a material for the gallium oxide epitaxial layer and being made of a material having a higher dielectric constant than the dielectric layer, forming an anode electrode on the upper surface of the gallium oxide epitaxial layer, the anode electrode forming a Schottky junction with the gallium oxide epitaxial layer, and forming a hetero pn junction between a lower surface of the oxide semiconductor layer and the gallium oxide substrate or between the lower surface of the oxide semiconductor layer and the gallium oxide epitaxial layer. With this configuration, in the manufacture of the oxide semiconductor device in which the hetero pn junction is formed of different types of oxide semiconductor materials, the p-type semiconductor layer can be formed without the need to control the p-type carrier density by doping with a p-type impurity. Specifically, the above-described structure can be achieved by forming the groove in the n-type gallium oxide epitaxial layer and forming the dielectric layer and the p-type oxide semiconductor layer in the groove.

The third aspect of the technique disclosed in the specification of the present application is the method of manufacturing an oxide semiconductor device. The method includes forming a cathode electrode on a lower surface of an n-type gallium oxide substrate, the cathode electrode forming an ohmic junction with the gallium oxide substrate, epitaxially growing an n-type first gallium oxide epitaxial layer on an upper surface of the gallium oxide substrate, forming a p-type oxide semiconductor layer on part of an upper surface of the first gallium oxide epitaxial layer, the p-type oxide semiconductor layer being made of an oxide that is a different material from a material for the first gallium oxide epitaxial layer, forming a dielectric layer on at least part of a side surface of the oxide semiconductor layer, the dielectric layer being made of a material having a lower dielectric constant than the material for the oxide semiconductor layer, epitaxially growing an n-type second gallium oxide epitaxial layer to cover the first gallium oxide epitaxial layer, the oxide semiconductor layer, and the dielectric layer, forming an anode electrode on the upper surface of the second gallium oxide epitaxial layer, the anode electrode forming a Schottky junction with the second gallium oxide epitaxial layer, and forming a hetero pn junction between a lower surface of the oxide semiconductor layer and the upper surface of the first gallium oxide epitaxial layer. With this configuration, in the manufacture of the oxide semiconductor device in which the hetero pn junction is formed of different types of oxide semiconductor materials, the p-type semiconductor layer can be formed without the need to control the p-type carrier density by doping with a p-type impurity. Specifically, the above-described structure can be achieved by forming the p-type oxide semiconductor layer and the dielectric layer on part of the upper surface of the n-type gallium oxide epitaxial layer and epitaxially growing the n-type gallium oxide epitaxial layer again so as to fill the gap between the oxide semiconductor layers.

The fourth aspect of the technique disclosed in the specification of the present application is an oxide semiconductor device that includes an n-type gallium oxide epitaxial layer formed on an upper surface of an n-type gallium oxide substrate, a p-type oxide semiconductor layer formed from an upper surface of the gallium oxide epitaxial layer to at least an inside of the gallium oxide epitaxial layer, the p-type oxide semiconductor layer being an oxide that is a different material from a material for the gallium oxide epitaxial layer, a dielectric layer formed to cover at least part of a side surface of the oxide semiconductor layer and made of a material having a lower dielectric constant than the material for the oxide semiconductor layer, a source electrode formed on the upper surface of the gallium oxide epitaxial layer and joined directly to the gallium oxide epitaxial layer and the oxide semiconductor layer, a gate electrode that is in contact with the gallium oxide epitaxial layer and the oxide semiconductor layer via the dielectric layer, and a drain electrode formed on a lower surface of the gallium oxide substrate and joined directly to the gallium oxide substrate. A hetero pn junction is formed between a lower surface of the gallium oxide epitaxial layer and the gallium oxide substrate. With this configuration, the oxide semiconductor device, in which the hetero pn junction is formed of different types of oxide semiconductor materials, can have an improved withstand voltage when an inverse voltage is applied, while suppressing diffusion of different types of materials to a Schottky interface.

The object, features, and advantages relating to the technique disclosed in the specification of the present application will become more apparent from the following detailed description and the accompanying drawings.

BRIEF DESCRIPTION OF DRAWINGS

FIG. 3 is a sectional view schematically illustrating a configuration of a semiconductor device according to another embodiment.

FIG. 4 is a sectional view schematically illustrating a configuration of a semiconductor device according to another embodiment.

FIG. 5 is a sectional view illustrating a step of manufacturing the semiconductor device according to the embodiment.

FIG. 6 is a sectional view illustrating a step of manufacturing the semiconductor device according to the embodiment.

FIG. 11 is a sectional view illustrating a step of manufacturing the semiconductor device according to the embodiment.

FIG. 12 is a sectional view illustrating a step of manufacturing the semiconductor device according to the embodiment.

FIG. 13 is a sectional view illustrating a step of manufacturing the semiconductor device according to the embodiment.

FIG. 14 is a sectional view illustrating a step of manufacturing the semiconductor device according to the embodiment.

FIG. 15 is a sectional view illustrating a step of manufacturing the semiconductor device according to the embodiment.

FIG. 16 is a sectional view illustrating a step of manufacturing the semiconductor device according to the embodiment.

FIG. 17 is a sectional view illustrating a step of manufacturing the semiconductor device according to the embodiment.

FIG. 18 is a sectional view illustrating a step of manufacturing the semiconductor device according to the embodiment.

FIG. 22 is a sectional view schematically illustrating a configuration of a semiconductor device according to another embodiment.

DESCRIPTION OF EMBODIMENTS

Hereinafter, embodiments will be described with reference to the accompanying drawings.

Note that the drawings are drawn in schematic form, and configurations may be appropriately omitted or simplified for convenience in description. Mutual relationships in size and position among configurations or the like illustrated in different drawings are not always accurate and can be appropriately changed.

In the following description, similar constituent elements are given and illustrated with the same reference signs, and they are assumed to have the same names and the same functions. Therefore, detailed description of such constituent elements may be omitted in some cases to avoid redundant description.

In the following description, terms that mean specific positions and directions, such as "upper," "lower," "left," "right," "side," "bottom," "front," and "back," are used in some cases, but these terms are merely used for the sake of convenience to facilitate understanding of the content of embodiments and may not relate to directions at the time of actual implementation.

In the following description, ordinal numbers such as "first" and "second" are used in some cases, but these terms are merely used for the sake of convenience to facilitate understanding of the content of embodiments and are not intended to limit a sequence or the like indicated by the ordinal numbers.

First Embodiment

An oxide semiconductor device according to the present embodiment and a method of manufacturing the oxide semiconductor device will be described hereinafter.

Configuration of Oxide Semiconductor Device

First, a configuration of the semiconductor device according to the present embodiment will be described.

Figure 1:
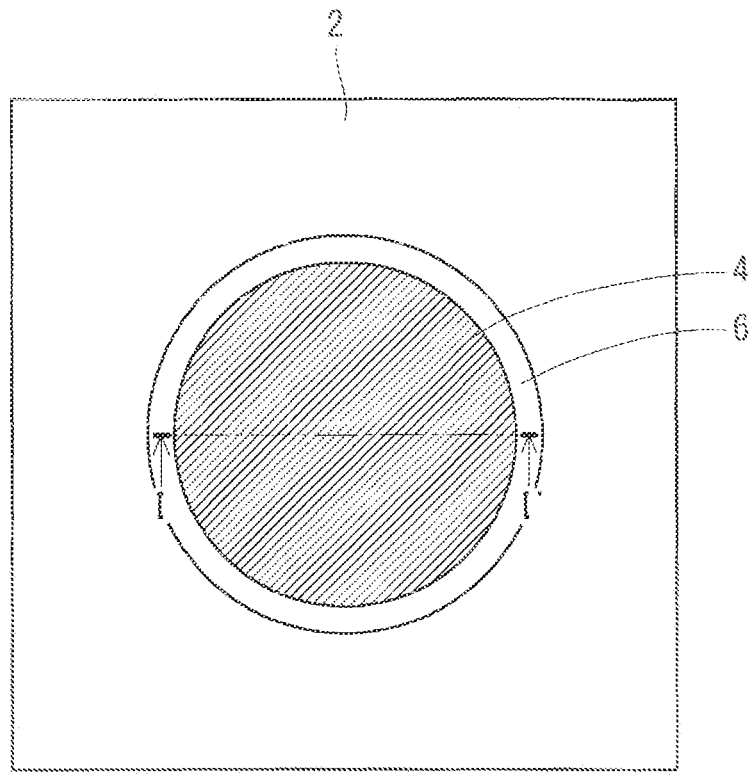
FIG. 1 is a plan view schematically illustrating a configuration for achieving a semiconductor device according to an embodiment.
Figure 2:
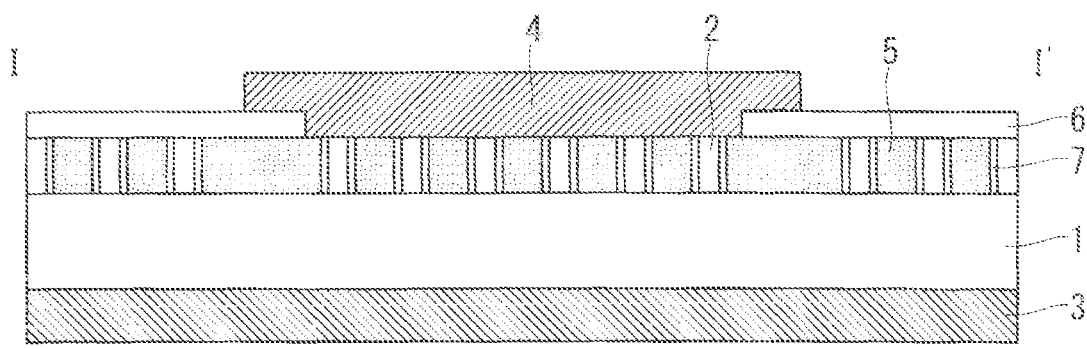
FIG. 2 is a sectional view schematically illustrating the configuration of the semiconductor device, taken along a section I-I' in FIG. 1.

FIG. 1 is a plan view schematically illustrating a configuration for achieving the semiconductor device according to the present embodiment. FIG. 2 is a sectional view schematically illustrating the configuration of the semiconductor device, taken along a section I-I' in FIG. 1.

As illustrated in FIGS. 1 and 2, the semiconductor device according to the present embodiment is an MPS that includes both Schottky barrier diodes (SBDs) and pn junction diodes (PNDs).

Although the present embodiment describes a Schottky barrier diode as the semiconductor device in which the anode electrode serves as a first electrode and the cathode electrode serves as a second electrode, the semiconductor device is not limited to a Schottky barrier diode and may be a semiconductor device that configures any other switching element.

As illustrated in FIG. 2, a single-crystal n-type gallium oxide substrate 1, which is an n-type oxide semiconductor, has a first main surface (i.e., upper surface) and a second main surface (i.e., lower surface) that is on the back side of the first main surface. The semiconductor device includes an n-type gallium oxide epitaxial layer 2 on the first main surface of the n-type gallium oxide substrate 1. The semiconductor device further includes a cathode electrode 3 on the second main surface of the n-type gallium oxide substrate 1 and an anode electrode 4 on the upper surface of the n-type gallium oxide epitaxial layer 2, the cathode electrode 3 forming an ohmic junction with the n-type gallium oxide substrate 1, and the anode electrode 4 forming a Schottky junction with the n-type gallium oxide epitaxial layer 2.

The semiconductor device further includes a plurality of p-type oxide semiconductor layers 5 formed from the upper surface of the n-type gallium oxide epitaxial layer 2 to the lower surface of the n-type gallium oxide epitaxial layer 2. The p-type oxide semiconductor layers 5 and the anode electrode 4 form an ohmic junction.

The semiconductor device further includes a field plate dielectric layer 6 between the n-type gallium oxide epitaxial layer 2 and the anode electrode 4. A portion where the field plate dielectric layer 6 and the anode electrode 4 are staked configures a field plate structure and improves the withstand voltage of the semiconductor device when an inverse voltage is applied.

The semiconductor device further includes a dielectric layer 7 formed on the entire surface of contact between the n-type gallium oxide epitaxial layer 2 and the p-type oxide semiconductor layers 5. The presence of the dielectric layer 7 prevents diffusion of atoms between the n-type gallium oxide epitaxial layer 2 and the p-type oxide semiconductor layers 5. This consequently reduces influences caused by the diffusion of atoms into a Schottky interface formed between the n-type gallium oxide epitaxial layer 2 and the anode electrode 4, and helps maintaining a normal Schottky interface.

The n-type gallium oxide substrate 1 is an n-type oxide semiconductor made of a single crystal of $Ga_2O_3$, and more preferably an n-type oxide semiconductor made of a single crystal of $\beta$-$Ga_2O_3$. The n-type gallium oxide substrate 1 exhibits n-type conductivity because of oxygen deficiency in crystals and therefore does not necessarily have to contain an n-type impurity, but may contain an n-type impurity such as silicon (Si) or tin (Sn).

That is, the n-type gallium oxide substrate 1 may be any of the following substrates: a substrate that exhibits n-type conductivity because of only oxygen deficiency, a substrate that exhibits n-type conductivity because of only an n-type impurity, and a substrate that exhibits n-type conductivity because of both oxygen deficiency and an n-type impurity.

An n-type carrier density in the n-type gallium oxide substrate 1 is a total density of oxygen deficiency and an n-type impurity, and for example, may be higher than or equal to $1 \times 10^{17}$ cm$^{-3}$ and less than or equal to $1 \times 10^{18}$ cm$^{-3}$. The impurity concentration may be set to a higher value in order to reduce contact resistance between the n-type gallium oxide substrate 1 and the anode electrode 4.

The n-type gallium oxide epitaxial layer 2 is formed on the upper surface of the n-type gallium oxide substrate 1. The n-type gallium oxide epitaxial layer 2 is an n-type oxide semiconductor made of a single crystal of $Ga_2O_3$, and more preferably an n-type oxide semiconductor made of a single crystal of $\beta$-$Ga_2O_3$. An n-type carrier density in the n-type gallium oxide epitaxial layer 2 is desirably lower than the n-type carrier density in the n-type gallium oxide substrate 1, and for example, may be higher than or equal to $1\times10^{15}$ cm$^{-3}$ and less than or equal to $1\times10^{17}$ cm$^{-3}$.

The cathode electrode 3 is formed on the lower surface of the n-type gallium oxide substrate 1. Since the cathode electrode 3 forms an ohmic junction with the n-type gallium oxide substrate 1, it is preferably made of a metal material whose work function is smaller than the work function of the n-type gallium oxide substrate 1. The cathode electrode 3 is preferably made of a metal material that reduces contact resistance between the n-type gallium oxide substrate 1 and the cathode electrode 3 through heat treatment performed after the cathode electrode 3 has been formed on the second main surface of the n-type gallium oxide substrate 1.

One example of the metal material is titanium (Ti). Alternatively, the cathode electrode 3 may be configured by stacking a plurality of metal materials. For example, in the case where a metal material that comes in contact with the second main surface of the n-type gallium oxide substrate 1 is an easily oxidized metal material, a metal material that is less likely to be oxidized may be formed on the lower surface of the easily oxidized metal material to configure the stacked structure of the cathode electrode 3. For example, the cathode electrode 3 may be configured by forming Ti as a first layer that comes in contact with the n-type gallium oxide substrate 1 and then forming a second layer made of gold (Au) or silver (Ag) on the lower surface of the first layer made of Ti. The cathode electrode 3 may be formed on the entire second main surface of the n-type gallium oxide substrate 1, or may be formed on part of the second main surface of the n-type gallium oxide substrate 1.

The anode electrode 4 is formed on the upper surface of the n-type gallium oxide epitaxial layer 2. Since the anode electrode 4 forms a Schottky junction with the n-type gallium oxide epitaxial layer 2, it is made of a metal material whose work function is larger than the work function of the n-type gallium oxide epitaxial layer 2. Since the anode electrode 4 also forms an ohmic junction with the p-type oxide semiconductor layer 5, the anode electrode 4 is preferably made of a metal material whose work function is smaller than the work function of the p-type oxide semiconductor material used for the p-type oxide semiconductor layers 5.

Examples of the metal material include platinum (Pt), nickel (Ni), gold (Au), and palladium (Pd). Like the cathode electrode 3, the anode electrode 4 may also have a stacked structure. For example, the anode electrode 4 may be configured by forming a metal material suited for the Schottky junction with the n-type gallium oxide epitaxial layer 2 as a first layer in contact with the n-type gallium oxide epitaxial layer 2 and then forming a metal material serving as a second layer on the upper surface of the first layer.

The p-type oxide semiconductor layers 5 are formed from the upper surface of the n-type gallium oxide epitaxial layer 2 to the lower surface thereof. The p-type oxide semiconductor layers 5 is directly joined to the n-type gallium oxide substrate 1. Then, hetero pn junctions are formed between the lower surfaces of the p-type oxide semiconductor layers 5 and the n-type gallium oxide substrate 1. The p-type oxide semiconductor layers 5 are configured of a p-type oxide semiconductor such as copper oxide ($Cu_2O$), iron oxide ($Ag_2O$), nickel oxide (NiO), or tin oxide (SnO) that exhibits p-type conductivity without being doped with a p-type impurity. For example, $Cu_2O$, which is a metal oxide, exhibits p-type conductivity because the 3d orbital of Cu forms the upper edge of the valence band that undertakes hole conduction, and holes appear due to Cu deficiency. Since $Cu_2O$ transforms into CuO due to oxidation, in that case the 3d orbital of Cu does not form the upper edge of the valence band. Accordingly, the p-type conductivity will be lost. The p-type oxide semiconductor layers 5 are configured of a p-type oxide semiconductor made of a metal oxide having such properties, and in general the p-type oxide semiconductor exhibits p-type conductivity without being doped with a p-type impurity.

Alternatively, the p-type oxide semiconductor layers 5 may be a p-type oxide semiconductor of $Cu_2O$, $Ag_2O$, NiO, or SnO that contains indium oxide ($In_2O_3$), gallium oxide ($Ga_2O_3$), or oxide zinc (ZnO). Although the p-type oxide semiconductor layers 5 are configured of a p-type oxide semiconductor that exhibits p-type conductivity without being doped with a p-type impurity as described above, the p-type oxide semiconductor layers 5 may be doped with a p-type impurity.

For example, in the case of $Cu_2O$, nitrogen (N) may be used as a p-type impurity. When the p-type oxide semiconductor layers are doped with a p-type impurity, the p-type carrier density is a total of metal atom deficiency in the p-type oxide semiconductor and the p-type impurity. Thus, although there are cases where the p-type oxide semiconductor layers 5 contain a p-type impurity and exhibit p-type conductivity as a whole even after the metal oxide of the p-type oxide semiconductors has been oxidized and lost p-type conductivity, it is important to prevent the metal oxide of the p-type oxide semiconductors from being oxidized, because the p-type conductivity of the p-type oxide semiconductors as a whole decreases if p-type conductivity is lost due to oxidation of the metal oxide.

The field plate dielectric layer 6 is made of, for example, a material such as silicon dioxide ($SiO_2$) or aluminum oxide ($Al_2O_3$), and such a material has a higher breakdown field strength than $Ga_2O_3$ that configures the n-type gallium oxide epitaxial layer 2. The thickness of the field plate dielectric layer 6 may be approximately several hundred nanometers, and for example, may be greater than or equal to 100 nm and less than or equal to 200 nm.

The dielectric layer 7 is made of, for example, a material such as silicon dioxide ($SiO_2$), silicon nitride (SiN), gallium nitride (GaN), or aluminum oxide ($Al_2O_3$). The dielectric layer 7 is formed to cover the entire side surfaces of the p-type oxide semiconductor layers 5, i.e., the entire surfaces that are along the current direction, which is a direction connecting the anode electrode 4 and the cathode electrode 3. The dielectric constant of the material for the dielectric layer 7 is lower than the dielectric constant of the material for the p-type oxide semiconductor layers 5. The dielectric layer 7 is provided in order to prevent diffusion of metal atoms from the p-type oxide semiconductor layers 5 toward the Schottky interface. Thus, the dielectric layer 7 is not limited to an insulation layer as long as the dielectric layer 7 can prevent diffusion of metal atoms from the p-type oxide semiconductor layers 5 toward the Schottky interface.

In the case where the dielectric layer 7 contains a metal oxide contained in the p-type oxide semiconductor layers 5 and a metal oxide forming a mixed crystal material, the thickness of the dielectric layer 7 is desirably greater than or equal to 3 nm, and may for example be greater than or equal to 3 nm and less than or equal to 300 nm.

Method of Manufacturing Oxide Semiconductor Device

Next, a method of manufacturing the semiconductor device according to the present embodiment will be described.

First, the cathode electrode 3 is formed on the second main surface of the n-type gallium oxide substrate 1. The n-type gallium oxide substrate 1 may be a substrate obtained by cutting a single-crystal bulk of β-$Ga_2O_3$ produced by a melt growth process in the form of a substrate.

Then, the n-type gallium oxide epitaxial layer 2 is accumulated through epitaxial growth on the first main surface of the n-type gallium oxide substrate 1. A method such as metal organic chemical vapor deposition (i.e., MOCVD), molecular beam epitaxy (i.e., MBE), or halide vapor phase epitaxy (i.e., HVPE) can be used to form the n-type gallium oxide epitaxial layer 2 on the first main surface of the n-type gallium oxide substrate 1.

Then, a metal material for the cathode electrode 3 is accumulated by vapor deposition or sputtering on the second main surface of the n-type gallium oxide substrate 1. For example, the cathode electrode 3 having a two-layer structure is formed by accumulating Ti to a thickness of 100 nm on the second main surface of the n-type gallium oxide substrate 1 by electron beam evaporation (EB evaporation) and then accumulating Ag to a thickness of 300 nm on the Ti by electron beam evaporation.

Thereafter, for example, heat treatment is performed at 550° C. for five minutes under a nitrogen or oxygen atmosphere. As a result, the cathode electrode 3 that forms an ohmic junction with the n-type gallium oxide substrate 1 is formed on the second main surface of the n-type gallium oxide substrate 1.

As a method of reducing contact resistance between the n-type gallium oxide substrate 1 and the cathode electrode 3, there is also a method in which, before the formation of the cathode electrode 3, a RIE process using gas such as boron trichloride ($BCl_3$) is performed on the second main surface of the n-type gallium oxide substrate 1.

Here, there are two methods as the method of forming the p-type oxide semiconductor layers 5 and the dielectric layer 7. The first method is forming grooves in the n-type gallium oxide epitaxial layer 2 and embedding the p-type oxide semiconductor layers 5 and the dielectric layer 7 in the grooves. The second method is forming the p-type oxide semiconductor layers 5 and the dielectric layer 7 on the first main surface of the n-type gallium oxide substrate 1 and then forming the n-type gallium oxide epitaxial layer 2 so as to bury these layers.

For example, in the case where the p-type oxide semiconductor layers 5 are formed of $Cu_2O$ by the second method, the p-type oxide semiconductor layers 5 can be formed by accumulating $Cu_2O$ on the first main surface of the n-type gallium oxide substrate 1 in a gas mixture of argon (Ar) and nitrogen ($N_2$) by sputtering using $Cu_2O$ as a target.

If a partial pressure of $N_2$ in the gas mixture is increased, it is possible to increase the carrier density in the p-type oxide semiconductor layers 5 and improve p-type conductivity. If the partial pressure of $N_2$ in the gas mixture is reduced, it is possible to reduce the carrier density in the p-type oxide semiconductor layers 5 and reduce p-type conductivity.

As a method of forming the grooves in the n-type gallium oxide epitaxial layer 2 by the first method, a dry etching method using gas such as $BCl_3$ is effective.

The method of forming the dielectric layer 7 is not particularly limited, and a known method such as sputtering or CVD can be used. The thickness of the dielectric layer 7 in the horizontal direction of the device is preferably a thickness that can prevent diffusion of metal atoms from the p-type oxide semiconductor layers 5 and that does not restrict the spread of the depletion layer as much as possible.

Second Embodiment

An oxide semiconductor device according to the present embodiment and a method of manufacturing the oxide semiconductor device will be described. In the following description, constituents similar to those described in the above embodiments are given and illustrated with the same reference signs, and detailed description thereof will be appropriately omitted.

Configuration of Oxide Semiconductor Device

FIG. 3 is a sectional view schematically illustrating a configuration of the semiconductor device according to the present embodiment. The semiconductor device illustrated in FIG. 3 differs in the length of a dielectric layer 7a extending in parallel with the current direction, i.e., the up-down direction in FIG. 3, from the mode exemplified in the first embodiment.

As illustrated in FIG. 3, the length of the dielectric layer 7a in the current direction is shorter than the length of the adjacent p-type oxide semiconductor layers 5 in the current direction. That is, the lower surface of the dielectric layer 7a is located in a shallower position than the lower surfaces of the p-type oxide semiconductor layers 5. Compared to the structure illustrated in the first embodiment, a structure is such that portions where the n-type gallium oxide epitaxial layer 2 and the p-type oxide semiconductor layers 5 are directly joined are located in close proximity the n-type gallium oxide substrate 1, and accordingly a depletion layer can easily spread in a direction perpendicular to the current direction of the device. This improves the withstand voltage of the semiconductor device when an inverse voltage is applied.

Third Embodiment

An oxide semiconductor device according to the present embodiment and a method of manufacturing the oxide semiconductor device will be described. In the following description, constituents similar to those described in the above embodiments are given and illustrated with the same reference signs, and detailed description thereof will be appropriately omitted.

Configuration of Oxide Semiconductor Device

FIG. 4 is a sectional view schematically illustrating a configuration of the semiconductor device according to the present embodiment. The semiconductor device illustrated in FIG. 4 differs in the length of p-type oxide semiconductor layers 5a and the length of a dielectric layer 7a, both extending in parallel with the current direction, i.e., the up-down direction in FIG. 4, from the mode illustrated in the first embodiment. Specifically, the p-type oxide semiconductor layers 5a are formed from the upper surface of the n-type gallium oxide epitaxial layer 2 to the inside thereof. The dielectric layer 7a is formed so as to cover the entire side surfaces of the p-type oxide semiconductor layers 5a. It is, however, noted that the p-type oxide semiconductor layers 5a and the dielectric layer 7a have the same length in a direction parallel to the current direction of the device.

As illustrated in FIG. 4, the length of the dielectric layer 7a in the current direction is equal to the length of the adjacent p-type oxide semiconductor layers 5a in the current direction, but compared to the structure illustrated in the first embodiment, the structure differs in that the dielectric layer 7a and the p-type oxide semiconductor layers 5a are both not in direct contact with the n-type gallium oxide substrate 1. The p-type oxide semiconductor layers 5a are directly joined to the n-type gallium oxide epitaxial layer 2. Then, hetero pn junctions are formed between the n-type gallium oxide epitaxial layer 2 and the lower surfaces of the p-type oxide semiconductor layers 5a. Since the faces of the p-type oxide semiconductor layers 5a that are perpendicular to the current direction of the device, i.e., the lower surfaces of the p-type oxide semiconductor layers 5a, are in direct contact with the n-type gallium oxide epitaxial layer 2, a depletion layer can easily spread in the structure. This improves the withstand voltage of the semiconductor device when an inverse voltage is applied.

Method of Manufacturing Oxide Semiconductor Device

Next, a method of manufacturing the semiconductor device according to the present embodiment will be described with reference to FIGS. 5 to 20. FIGS. 5 to 20 are sectional views illustrating steps of manufacturing the semiconductor device according to the present embodiment.

As described above, there are two methods of forming the p-type oxide semiconductor layers 5a and the dielectric layer 7a. Each method will now be described.

Referring first to the first method, the n-type gallium oxide substrate 1 is prepared as illustrated in FIG. 5. Then, as illustrated in FIG. 6, a metal material for the cathode electrode 3 is accumulated on the second main surface of the n-type gallium oxide substrate 1 by vapor deposition or sputtering.

Figure 7:
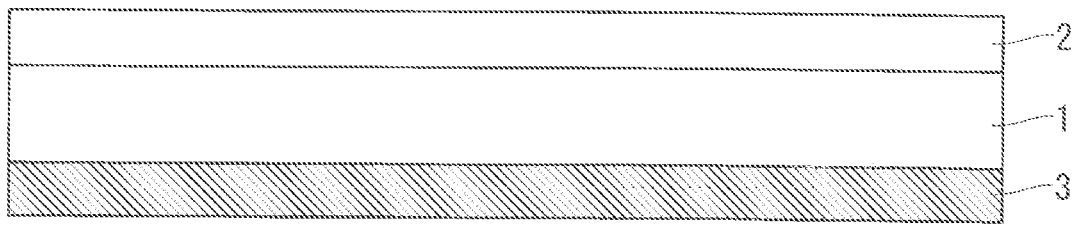
FIG. 7 is a sectional view illustrating a step of manufacturing the semiconductor device according to the embodiment.

Then, as illustrated in FIG. 7, the n-type gallium oxide epitaxial layer 2 is accumulated through epitaxial growth on the first main surface of the n-type gallium oxide substrate 1.

Figure 8:
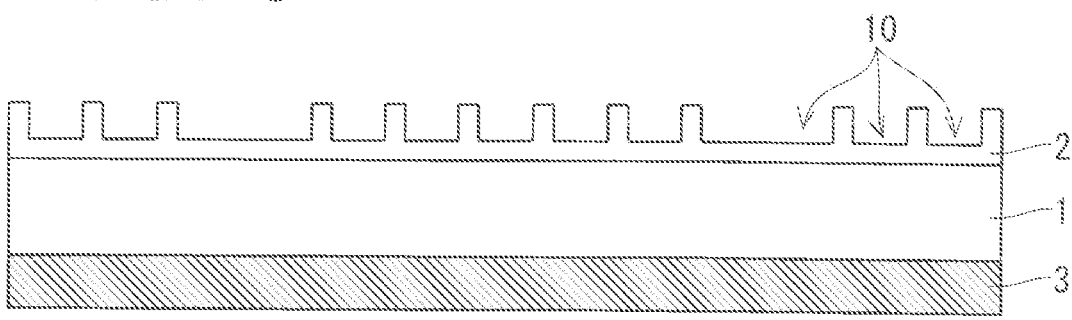
FIG. 8 is a sectional view illustrating a step of manufacturing the semiconductor device according to the embodiment.

Then, grooves 10 are formed in the surface of the n-type gallium oxide epitaxial layer 2 as illustrated in FIG. 8. The grooves 10 are formed to a depth that does not reach the n-type gallium oxide substrate 1, but may be formed to a depth that reaches the n-type gallium oxide substrate 1. As a method of forming the grooves 10, dry etching using gas such as $BCl_3$ is effective.

Figure 9:
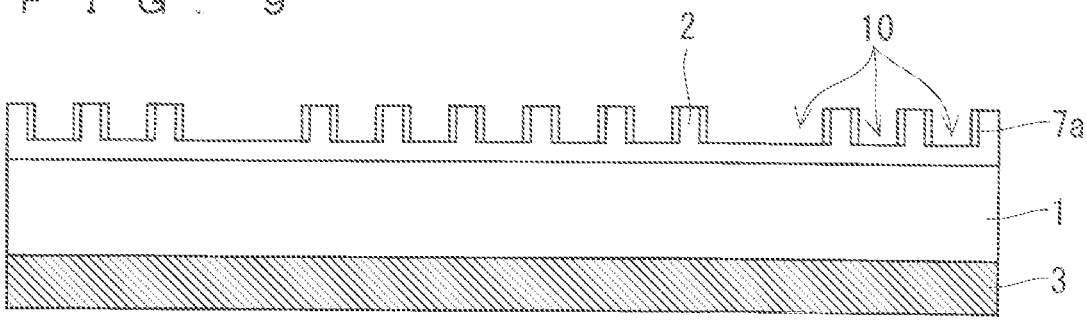
FIG. 9 is a sectional view illustrating a step of manufacturing the semiconductor device according to the embodiment.
Figure 10:
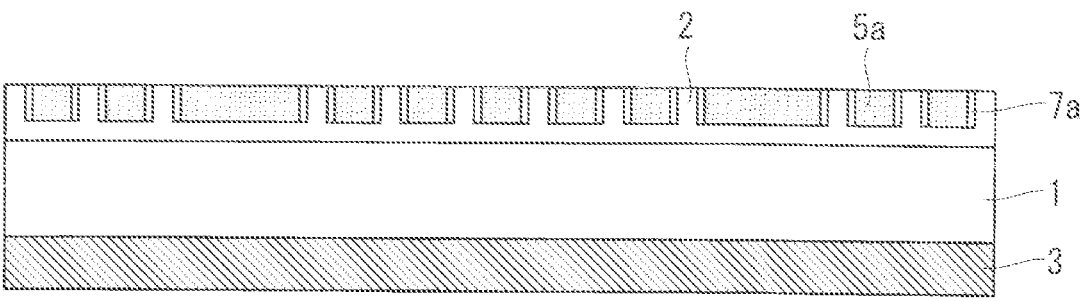
FIG. 10 is a sectional view illustrating a step of manufacturing the semiconductor device according to the embodiment.
Figure 21:
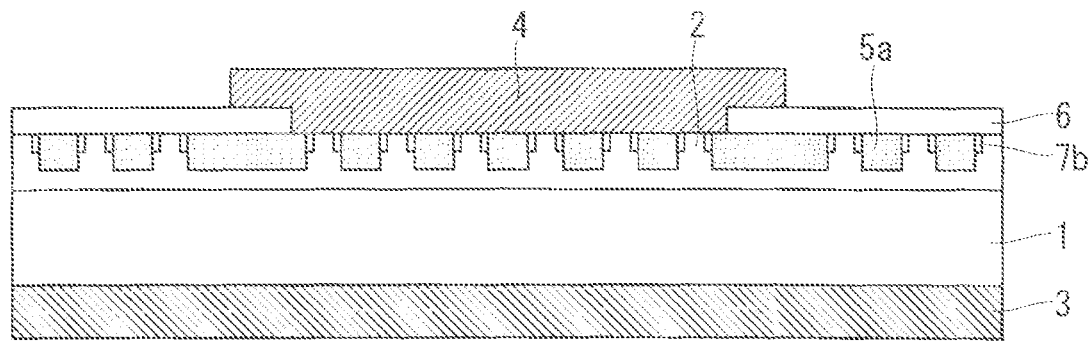
FIG. 21 is a sectional view schematically illustrating a configuration of a semiconductor device according to another embodiment.

Then, as illustrated in FIG. 9, the dielectric layer 7a is formed on the n-type gallium oxide epitaxial layer 2, excluding the bottom faces of the grooves 10. For example, the dielectric layer 7a is formed by lift-off involving photolithography. Specifically, a resist having openings is formed on the side surfaces of the grooves 10 and is then lift off after deposition of the material for the dielectric layer 7a. In the case of forming a structure as illustrated in FIGS. 3 and 21 in which the lower surface of the dielectric layer 7a is located in a shallower position than the lower surfaces of the p-type oxide semiconductor layers 5, a resist may be formed so as to cover portions of the side surfaces of the grooves 10 that are close to the bottom faces of the grooves 10, and then the resist may be lift off after deposition of the material for the dielectric layer 7a. Then, the p-type oxide semiconductor layers 5a are formed in the grooves 10 as illustrated in FIG. 10.

Then, as illustrated in FIG. 11, the field plate dielectric layer 6 is formed on part of the upper surface of the n-type gallium oxide epitaxial layer 2, including the grooves 10 filled with the p-type oxide semiconductor layers 5a.

Then, as illustrated in FIG. 12, the anode electrode 4 is formed spanning from part of the field plate dielectric layer 6 to the upper surface of the n-type gallium oxide epitaxial layer 2 that is not covered with the field plate dielectric layer 6.

According to the above-described manufacturing method, the p-type oxide semiconductor layers 5a can be formed without being affected by a temperature necessary to form the n-type gallium oxide epitaxial layer 2, and therefore the p-type oxide semiconductor layers 5a can be formed at a relatively low temperature, e.g., 200° C. or less. This suppresses crystallization of the p-type oxide semiconductor layers 5a and makes it possible to improve the withstand voltage of the device and reduce leakage current when an inverse voltage is applied.

In the above-described manufacturing method, the n-type gallium oxide epitaxial layer 2 illustrated in FIG. 7 may be formed before the cathode electrode 3 illustrated in FIG. 6 is formed.

Next, the second method will be described. First, the n-type gallium oxide substrate 1 is prepared as illustrated in FIG. 13. Then, a metal material for the cathode electrode 3 is accumulated on the second main surface of the n-type gallium oxide substrate 1 by vapor deposition or sputtering as illustrated in FIG. 14.

Then, as illustrated in FIG. 15, an n-type gallium oxide epitaxial layer 2a is accumulated to a relatively small thickness through epitaxial growth on the first main surface of the n-type gallium oxide substrate 1.

Then, as illustrated in FIG. 16, the p-type oxide semiconductor layers 5a are accumulated on part of the upper surface of the n-type gallium oxide epitaxial layer 2a by sputtering.

Then, the dielectric layer 7a is formed on the side surfaces of the p-type oxide semiconductor layers 5a as illustrated in FIG. 17. For example, the dielectric layer 7a is formed by lift-off involving photolithography. Specifically, a resist having openings is formed on the side surfaces of the p-type oxide semiconductor layers 5a and is then lift off after deposition of the material for the dielectric layer 7a. In the case of forming a structure as illustrated in FIGS. 3 and 21 in which the lower surface of the dielectric layer 7a is located in a shallower position than the lower surfaces of the p-type oxide semiconductor layers 5, a resist may be formed so as to cover portions of the side surfaces of the p-type oxide semiconductor layers 5a that are close to the upper surface of the n-type gallium oxide epitaxial layer 2a, and the resist may be lift off after deposition of the material for the dielectric layer 7a. Then, regions where the p-type oxide semiconductor layers 5a are not formed are epitaxially grown again so as to form an n-type gallium oxide epitaxial layer 2b as illustrated in FIG. 18. Here, the n-type gallium oxide epitaxial layer 2a and the n-type gallium oxide epitaxial layer 2b form the n-type gallium oxide epitaxial layer 2.

Figure 19:
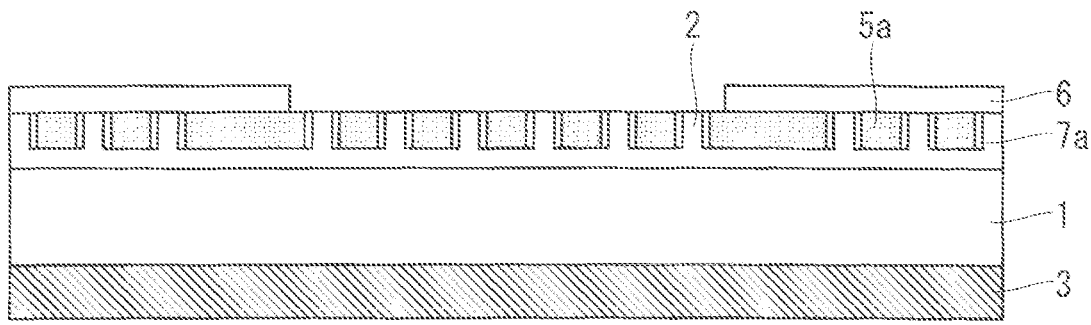
FIG. 19 is a sectional view illustrating a step of manufacturing the semiconductor device according to the embodiment.

Then, as illustrated in FIG. 19, the field plate dielectric layer 6 is formed on part of the upper surfaces of the p-type oxide semiconductor layers 5a and on part of the upper surface of the n-type gallium oxide epitaxial layer 2.

Figure 20:
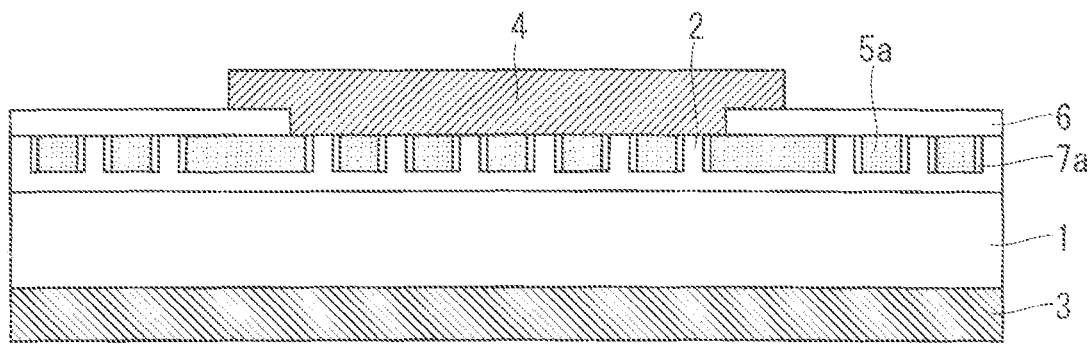
FIG. 20 is a sectional view illustrating a step of manufacturing the semiconductor device according to the embodiment.

Then, as illustrated in FIG. 20, the anode electrode 4 is formed spanning from part of the field plate dielectric layer 6 to the upper surface of the n-type gallium oxide epitaxial layer 2 that is not covered with the field plate dielectric layer 6.

The above-described manufacturing method can also provide a semiconductor device having a structure similar to the structure obtained in FIG. 12.

The method of manufacturing the semiconductor device illustrated in FIGS. 5 to 20 uses, for example, photolithography in some cases.

Fourth Embodiment

An oxide semiconductor device according to the present embodiment and a method of manufacturing the oxide semiconductor device will be described. In the following description, constituents similar to those described in the above embodiments are given and illustrated with the same reference signs, and detailed description thereof will be appropriately omitted.

Configuration of Oxide Semiconductor Device

FIG. 21 is a sectional view schematically illustrating a configuration of the semiconductor device according to the present embodiment. The semiconductor device illustrated in FIG. 21 differs in the length of a dielectric layer 7b extending in parallel with the current direction, i.e., the up-down direction in FIG. 21, from the mode illustrated in the third embodiment.

As illustrated in FIG. 21, the length of the dielectric layer 7b in the current direction is shorter than the length of the adjacent p-type oxide semiconductor layers 5a in the current direction. Compared to the structure illustrated in the third embodiment, a structure is such that portions where the n-type gallium oxide epitaxial layer 2 and the p-type oxide semiconductor layers 5a are directly joined are located at positions of the p-type oxide semiconductor layers 5a that are close to the n-type gallium oxide substrate 1, and accordingly a depletion layer can easily spread in a direction perpendicular to the current direction of the device. This improves the withstand voltage of the semiconductor device when an inverse voltage is applied.

Operations of Oxide Semiconductor Device

Next, operations of the semiconductor device according to the present embodiment will be described.

Between the anode electrode 4 and cathode electrode 3 of the semiconductor device, a voltage is applied from an electric circuit provided outside the semiconductor device. Forward biasing refers to a case where the application of voltage causes the potential of the anode electrode 4 to become higher than the potential of the cathode electrode 3, and reverse biasing refers to a case where the application of voltage causes the potential of the anode electrode 4 to become lower than the potential of the cathode electrode 3.

In the semiconductor device according to the present embodiment, when a forward bias is applied, forward current flows from the anode electrode 4 to the cathode electrode 3, and when a reverse bias is applied, the current flowing between the anode electrode 4 and the cathode electrode 3 is cut off.

The p-type oxide semiconductor layers 5a form an ohmic junction with the anode electrode 4, and the n-type gallium oxide epitaxial layer 2 forms an ohmic junction with the cathode electrode 3 via the n-type gallium oxide substrate 1. Thus, when a reverse bias is applied to the semiconductor device, the potential of the p-type oxide semiconductor layers 5a becomes lower than the potential of the n-type gallium oxide epitaxial layer 2.

As a result, the thickness of the depletion layer that spreads toward the n-type gallium oxide epitaxial layer 2 increases, and the semiconductor device is forced to a pinch-off state. Then, the depletion layer covers the entire Schottky junction portion between the n-type gallium oxide epitaxial layer 2 and the anode electrode 4.

Since the depletion layer is an insulator, most of the reverse bias voltage applied between the anode electrode 4 and the cathode electrode 3 is applied to the depletion layer, and the voltage applied to the Schottky junction portion between the n-type gallium oxide epitaxial layer 2 and the anode electrode 4 considerably decreases as compared with the case where there is no depletion layer. As a result, it is possible to improve the withstand voltage of the semiconductor device when an inverse voltage is applied.

In the case of a gallium oxide semiconductor, although the n-type carrier density can easily be controlled by doping with an n-type impurity such as Si or Sn, it is extremely difficult to control the p-type carrier density by doping with a p-type impurity. There have been no reports stating that evident hole conduction was observed as a result of doping with a p-type impurity.

Thus, it is difficult to improve the withstand voltage of the Schottky junction portion when an inverse voltage is applied, by doping the n-type gallium oxide epitaxial layer 2 with a p-type impurity and thereby forming a p-type semiconductor, as performed in the case of the semiconductor device formed of Si or SiC.

The semiconductor device according to the present embodiment achieves a configuration in which a depletion layer is formed within the n-type gallium oxide epitaxial layer 2 by hetero pn junctions generated as a result of forming the p-type oxide semiconductor layers 5a of a material different from gallium oxide within the n-type gallium oxide epitaxial layer 2.

In the semiconductor device according to the present embodiment, the dielectric layer 7b is provided on part of the face between the n-type gallium oxide epitaxial layer 2 and the p-type oxide semiconductor layers 5a, the face being parallel to the current direction of the device. Accordingly, it is possible to suppress the influence of metal atoms diffused from the p-type oxide semiconductor layers 5a on the Schottky interface.

Fifth Embodiment

An oxide semiconductor device according to the present embodiment and a method of manufacturing the oxide semiconductor device will be described. In the following description, constituents similar to those described in the above embodiments are given and illustrated with the same reference signs, and detailed description thereof will be appropriately omitted.

Configuration of Oxide Semiconductor Device

FIG. 22 is a sectional view schematically illustrating a configuration of the semiconductor device according to the present embodiment. The semiconductor device illustrated in FIG. 22 is a field-effect transistor in which the current direction is the up-down direction in FIG. 22.

As illustrated in FIG. 22, an n-type gallium oxide epitaxial layer 2c is formed on the upper surface of an n-type gallium oxide substrate 1. Then, a p-type oxide semiconductor layer 5c is formed in the surface of the n-type gallium oxide epitaxial layer 2c.

A gate electrode 12 is formed in the surface of the p-type oxide semiconductor layer 5c. Then, a dielectric layer 7c is formed so as to sandwich the gate electrode 12 in plan view. The dielectric layer 7c is formed in contact with not only the side surface of the gate electrode 12 but also part of the lower surface of the gate electrode 12. The dielectric layer 7c and the p-type oxide semiconductor layer 5c are directly joined.

A source electrode 11 is formed on the upper surface of the n-type gallium oxide epitaxial layer 2c. The source electrode 11 is directly joined to the n-type gallium oxide epitaxial layer 2c. Also, a drain electrode 13 is formed on the lower surface of the n-type gallium oxide substrate 1.

The p-type oxide semiconductor layer 5c is directly joined to the source electrode 11 at some point in the depth direction in FIG. 22. In this case, the p-type oxide semiconductor layer 5c may be formed so as to extend to immediately below the source electrode 11, or the source electrode 11 may be formed so as to extend to immediately above p-type oxide semiconductor layer 5c.

FIG. 22 shows the source electrode 11 that is drawn to come in contact with the p-type oxide semiconductor layer 5c. The dielectric layer 7c is inserted into the interface between the upper portion of the p-type oxide semiconductor layer 5c and the n-type gallium oxide epitaxial layer 2c. Thus, like the structures illustrated in the above-described embodiments, this structure can suppress diffusion of atoms between the p-type oxide semiconductor layer and the n-type gallium oxide epitaxial layer 2c because of the presence of the dielectric layer 7c formed on the side surface of the p-type oxide semiconductor layer 5c. Accordingly, this structure has the effect of suppressing a shift in threshold value at the interface between the electrode and the semiconductor layer.

This structure is a field-effect transistor that controls the amount of current flowing between the source electrode 11 and the drain electrode 13 by applying a voltage to the gate electrode 12.

The semiconductor device according to the present embodiment achieves a configuration in which a depletion layer is formed within the n-type gallium oxide epitaxial layer 2c by hetero pn junctions generated as a result of forming the p-type oxide semiconductor layer 5c of a material different from gallium oxide within the n-type gallium oxide epitaxial layer 2c.

That is, the p-type oxide semiconductor layer 5c disposed immediately below the gate electrode 12 brings about a field relieving effect and achieves an effect of improving the withstand voltage when an inverse voltage is applied to the source electrode 11 and the drain electrode 13.

In the semiconductor device according to the present embodiment, the dielectric layer 7c is provided on part of the face between the n-type gallium oxide epitaxial layer 2c and the p-type oxide semiconductor layer 5c, the face being parallel to the current direction of the device. Thus, metal atoms diffused from the p-type oxide semiconductor layer 5c can suppress a shift in threshold value at the interface between the source electrode 11 and the n-type gallium oxide epitaxial layer 2c.

With this configuration, the oxide semiconductor device, in which the hetero pn junctions are formed of different types of oxide semiconductor materials, can have an improved withstand voltage when an inverse voltage is applied, while suppressing diffusion of different types of materials to the interface between the electrode and the semiconductor.

Effects Achieved by Above-Described Embodiments

Next, effects achieved by the above-described embodiments are exemplified. In the following description, the effects are described based on specific configurations exemplified in the above-described embodiments, but those specific configurations may be replaced by other specific configurations exemplified in the specification of the present application within a range that can produce similar effects.

This replacement can be made across a plurality of embodiments. That is, similar effects can be produced by combining configurations exemplified in different embodiments.

According to the above-described embodiments, the oxide semiconductor device includes the n-type gallium oxide epitaxial layer, the p-type oxide semiconductor layer, the dielectric layer 7, the anode electrode 4, and the cathode electrode 3. Here, the gallium oxide epitaxial layer corresponds to, for example, the n-type gallium oxide epitaxial layer 2. The oxide semiconductor layer corresponds to, for example, at least one of the p-type oxide semiconductor layers 5 and the p-type oxide semiconductor layers 5a. The n-type gallium oxide epitaxial layer 2 is formed on the upper surface of the n-type gallium oxide substrate 1. The oxide semiconductor layer is formed from the upper surface of the n-type gallium oxide epitaxial layer 2 to at least the inside thereof. The oxide semiconductor layer is made of an oxide that is a different material from the material for the n-type gallium oxide epitaxial layer 2. The dielectric layer 7 is formed so as to cover at least part of the side surface of the oxide semiconductor layer. The dielectric layer 7 is made of a material having a lower dielectric constant than the material for the oxide semiconductor layer. The anode electrode 4 is formed on the upper surface of the n-type gallium oxide epitaxial layer 2. The anode electrode 4 forms a Schottky junction with the n-type gallium oxide epitaxial layer 2. The cathode electrode 3 is formed on the lower surface of the n-type gallium oxide substrate 1. The cathode electrode 3 forms an ohmic junction with the n-type gallium oxide substrate 1. Then, hetero pn junctions are formed between the lower surfaces of the p-type oxide semiconductor layers 5 and the n-type gallium oxide substrate 1 or between the lower surfaces of the p-type oxide semiconductor layers 5a and the n-type gallium oxide epitaxial layer 2.

With this configuration, the oxide semiconductor device, in which the hetero pn junctions are formed of different types of oxide semiconductor materials, can have an improved withstand voltage when an inverse voltage is applied, while suppressing diffusion of different types of materials to the Schottky interface. Specifically, the presence of the dielectric layer 7 formed on the side surfaces of the p-type oxide semiconductor layers suppresses diffusion of atoms between the p-type oxide semiconductor layers and the n-type gallium oxide epitaxial layer 2.

Note that other configurations exemplified in the specification of the present application, excluding the above-described configuration, can be appropriately omitted. That is, the above-described effects can be achieved if, at least, the above-described configuration is included.

However, the above-described effects can be achieved in the same manner even in the case where at least one of the other configurations exemplified in the specification of the present application is appropriately added to the above-described configuration, i.e., in the case where other configurations that are not described as the above-described configuration but exemplified in the specification of the present application are added to the above-described configuration.

According to the above-described embodiments, the side surfaces of the p-type oxide semiconductor layers 5 are faces that are along the current direction connecting the anode electrode 4 and the cathode electrode 3, e.g., the up-down direction in FIG. 2. With this configuration, the presence of the dielectric layer 7 formed on the side surfaces of the p-type oxide semiconductor layers 5 can suppress diffusion of atoms to the Schottky interface without restricting the spread of the depletion layer.

According to the above-described embodiments, the lower surface of the dielectric layer 7a is located in a shallower position than the lower surfaces of the p-type oxide semiconductor layers 5. With this configuration, the p-type oxide semiconductor layers 5 are formed so as to extend closer to the cathode electrode 3 than the dielectric layer 7a. Accordingly, it is possible to provide a semiconductor device that achieves low reverse leakage current and a high withstand voltage when an inverse voltage is applied, while suppressing diffusion of atoms to the Schottky interface.

According to the above-described embodiments, the dielectric layer 7 is formed so as to cover the entire side surfaces of the p-type oxide semiconductor layers 5. With this configuration, the diffusion of atoms to the Schottky interface can be suppressed.

According to the above-described embodiments, the p-type oxide semiconductor layers 5a are formed from the upper surface of the n-type gallium oxide epitaxial layer 2 to the inside thereof. Then, the hetero pn junctions are formed between the lower surfaces of the p-type oxide semiconductor layers 5a and the n-type gallium oxide epitaxial layer 2. With this configuration, the lower surfaces of the p-type oxide semiconductor layers 5a are directly joined to the n-type gallium oxide epitaxial layer 2, and the entire side surfaces of the p-type oxide semiconductor layers 5a are covered with the dielectric layer 7a. Thus, it is possible to reduce leakage current while improving the withstand voltage when an inverse voltage is applied.

According to the above-described embodiments, the p-type oxide semiconductor layers 5 are formed from the upper surface of the n-type gallium oxide epitaxial layer 2 to the lower surface thereof. Then, the hetero pn junctions are formed between the lower surfaces of the p-type oxide semiconductor layers 5 and the n-type gallium oxide substrate 1. With this configuration, the lower surfaces of the p-type oxide semiconductor layers 5 are directly joined to the n-type gallium oxide substrate 1, and the entire side surfaces of the p-type oxide semiconductor layers 5 are covered with the dielectric layer 7. Thus, it is possible to reduce leakage current while improving the withstand voltage when an inverse voltage is applied.

According to the above-described embodiments, the impurity concentration in the n-type gallium oxide epitaxial layer 2 is lower than the impurity concentration in the n-type gallium oxide substrate 1. With this configuration, if the concentration in the drift layer is reduced, it is possible to reduce leakage current while improving the withstand voltage when an inverse voltage is applied.

According to the above-described embodiments, the p-type oxide semiconductor layers 5 are a metal oxide that contains Cu or Ni. With this configuration, the use of $Cu_2O$ or NiO as the p-type oxide semiconductor layers 5 makes it possible to reduce leakage current while improving the withstand voltage when an inverse voltage is applied.

According to the above-described embodiments, in the method of manufacturing the oxide semiconductor device, the cathode electrode 3 that forms an ohmic junction with the n-type gallium oxide substrate 1 is formed on the lower surface of the n-type gallium oxide substrate 1. Then, the n-type gallium oxide epitaxial layer 2 is epitaxially grown on the upper surface of the n-type gallium oxide substrate 1. Then, the grooves 10 are formed from the upper surface of the n-type gallium oxide epitaxial layer 2 to at least the inside thereof. Then, the dielectric layer 7 is formed on at least part of the side surfaces of the grooves 10. Then, the p-type oxide semiconductor layers are formed in the grooves 10 in which the dielectric layer 7 has been formed on the side surfaces, the p-type oxide semiconductor layers being an oxide that is a different material from the material for the n-type gallium oxide epitaxial layer 2 and being made of a material having a higher dielectric constant than the dielectric layer 7. Then, the anode electrode 4 that forms a Schottky junction with the n-type gallium oxide epitaxial layer 2 is formed on the upper surface of the n-type gallium oxide epitaxial layer 2. Here, the hetero pn junctions are formed between the lower surfaces of the p-type oxide semiconductor layers 5 and the n-type gallium oxide substrate 1 or between the lower surfaces of the p-type oxide semiconductor layers 5a and the n-type gallium oxide epitaxial layer 2.

With this configuration, in the manufacture of the oxide semiconductor device in which the hetero pn junctions are formed by different types of oxide semiconductor materials, the p-type semiconductor layers can be formed without controlling the p-type carrier density by doping with a p-type impurity. Specifically, the above-described structure can be achieved by forming the grooves in the n-type gallium oxide epitaxial layer 2 and forming the dielectric layer 7 and the p-type oxide semiconductor layers in the grooves.

Note that other configurations exemplified in the specification of the present application, excluding the above-described configuration, can be appropriately omitted. That is, the above-described effects can be achieved if, at least, the above-described configuration is included.

However, the above-described effects can be achieved in the same manner even in the case where at least one of the other configurations exemplified in the specification of the present application is appropriately added to the above-described configuration, i.e., in the case where other configurations that are not described as the above-described configuration but exemplified in the specification of the present application are added to the above-described configuration.

Unless there are particular limitations, the sequence of processes may be changed.

According to the above-described embodiments, the p-type oxide semiconductor layers 5a are formed at a temperature less than or equal to 200° C. With this configuration, the crystallization of the p-type oxide semiconductor layers 5a can be suppressed by forming the p-type oxide semiconductor layers 5a at a temperature less than or equal to 200° C. Accordingly, it is possible to reduce leakage current while improving the withstand voltage of the device when an inverse voltage is applied.

According to the above-described embodiments, the grooves 10 are formed from the upper surface of the n-type gallium oxide epitaxial layer 2 to the inside thereof. Then, the hetero pn junctions are formed between the lower surfaces of the p-type oxide semiconductor layers 5a and the n-type gallium oxide epitaxial layer 2. With this configuration, the lower surfaces of the p-type oxide semiconductor layers 5a are directly joined to the n-type gallium oxide epitaxial layer 2. Thus, it is possible to reduce leakage current while improving the withstand voltage when an inverse voltage is applied.

According to the above-described embodiments, the grooves 10 are formed from the upper surface of the n-type gallium oxide epitaxial layer 2 to the lower surface thereof. Then, the hetero pn junctions are formed between the lower surfaces of the p-type oxide semiconductor layers 5 and the n-type gallium oxide substrate 1. With this configuration, the lower surfaces of the p-type oxide semiconductor layers 5 are directly joined to the n-type gallium oxide substrate 1. Thus, it is possible to reduce leakage current while improving the withstand voltage when an inverse voltage is applied.

According to the above-described embodiments, the cathode electrode 3 that forms an ohmic junction with the n-type gallium oxide substrate 1 is formed on the lower surface of the n-type gallium oxide substrate 1. Then, an n-type first gallium oxide epitaxial layer is epitaxially grown on the upper surface of the n-type gallium oxide substrate 1. Here, the first gallium oxide epitaxial layer corresponds to, for example, the n-type gallium oxide epitaxial layer 2a. Then, the p-type oxide semiconductor layers 5a, which are made of an oxide that is a different material from the material for the n-type gallium oxide epitaxial layer 2a, are formed on part of the upper surface of the n-type gallium oxide epitaxial layer 2a. Then, the dielectric layer 7 made of a material having a lower dielectric constant than the material for the p-type oxide semiconductor layers 5a is formed on at least part of the side surfaces of the p-type oxide semiconductor layers 5a. Then, an n-type second gallium oxide epitaxial layer is epitaxially gown so as to cover the n-type gallium oxide epitaxial layer 2a, the p-type oxide semiconductor layers 5a, and the dielectric layer 7. Here, the second gallium oxide epitaxial layer corresponds to, for example, the n-type gallium oxide epitaxial layer 2b. Then, the anode electrode 4 that forms a Schottky junction with the n-type gallium oxide epitaxial layer 2b is formed on the upper surface of the n-type gallium oxide epitaxial layer 2b. Here, the hetero pn junctions are formed between the lower surfaces of the p-type oxide semiconductor layers 5a and the n-type gallium oxide epitaxial layer 2a.

With this configuration, in the manufacture of the oxide semiconductor device in which the hetero pn junctions are formed of different types of oxide semiconductor materials, the p-type semiconductor layers can be formed without controlling the p-type carrier density by doping with a p-type impurity. Specifically, the above-described structure can be achieved by forming the p-type oxide semiconductor layers and the dielectric layer 7 on part of the upper surface of the n-type gallium oxide epitaxial layer 2a and epitaxially growing the n-type gallium oxide epitaxial layer again so as to fill the gap between the oxide semiconductor layers.

Note that other configurations exemplified in the specification of the present application, except the above-described configuration, can be appropriately omitted. That is, the above-described effects can be achieved if, at least, the above-described configuration is included.

However, the above-described effects can be achieved in the same manner even in the case where at least one of the other configurations exemplified in the specification of the present application is appropriately added to the above-described configuration, i.e., in the case where other configurations that are not described as the above-described configuration but exemplified in the specification of the present application are added to the above-described configuration.

Unless there are particular limitations, the sequence of processes may be changed.

Variations of Above-Described Embodiments

While the above-described embodiments may in some cases describe the quality of materials, material, dimensions, shape, and relative locations and arrangement of each constituent element, conditions for implementation, and the like, these features are all illustrative in all aspects and are not limited to the examples described in the specification of the present application.

Accordingly, an unlimited number of variations and equivalents that are not exemplified are assumed to fall within the scope of the technique disclosed in the specification of the present application. For example, the scope of the technique is assumed to include cases where at least one constituent element is modified, added, or omitted and cases where at least one constituent element in at least one embodiment is extracted and combined with constituent elements in other embodiments.

In the above-described embodiments, "one" constituent element may include "one or more" constituent elements as long as no contradiction arises.

Each constituent element in the above-describe embodiments is perceived as a conceptual unit, and the scope of the technique disclosed in the specification of the present application is assumed to include cases where one constituent element is configured by a plurality of structural elements, cases where one constituent element corresponds to part of a certain structural element, and cases where a plurality of constituent elements is included in one structural element.

Each constituent element described in the above-described embodiments is assumed to include structural elements having other structures or shapes as long as it can achieve the same function.

The description in the specification of the present application shall be referred to for all purposes relating to the technique of the present application, and nothing in the specification shall be regarded as conventional technology.

When features such as material names are described with no particular indication in the above-described embodiments, those materials are assumed to include other additives such as an alloy, as long as no contradiction arises.

EXPLANATION OF REFERENCE SIGNS

1: n-type gallium oxide substrate, 2, 2a, 2b, 2c: n-type gallium oxide epitaxial layer, 3: cathode electrode, 4: anode electrode, 5, 5a, 5c: p-type oxide semiconductor layer, 6: field plate dielectric layer, 7, 7a, 7b, 7c: dielectric layer, 10: groove, 11: source electrode, 12: gate electrode, 13: drain electrode

The invention claimed is:
1. An oxide semiconductor device comprising:
an n-type gallium oxide epitaxial layer formed on an upper surface of an n-type gallium oxide substrate;
a p-type oxide semiconductor layer formed from an upper surface of the gallium oxide epitaxial layer to at least an inside of the gallium oxide epitaxial layer, the p-type oxide semiconductor layer being an oxide that is a different material from a material for the gallium oxide epitaxial layer;
a dielectric layer formed to cover at least part of a side surface of the oxide semiconductor layer and made of a material having a lower dielectric constant than the material for the oxide semiconductor layer;
an anode electrode formed on the upper surface of the gallium oxide epitaxial layer and forming a Schottky junction with the gallium oxide epitaxial layer; and
a cathode electrode formed on a lower surface of the gallium oxide substrate and forming an ohmic junction with the gallium oxide substrate,
wherein a hetero pn junction is formed between a lower surface of the oxide semiconductor layer and the gallium oxide substrate or between a lower surface of the oxide semiconductor layer and the gallium oxide epitaxial layer.
2. The oxide semiconductor device according to claim 1, wherein
the side surface of the oxide semiconductor layer is a face that is along a current direction that is a direction connecting the anode electrode and the cathode electrode.

3. The oxide semiconductor device according to claim 1, wherein
a lower surface of the dielectric layer is located in a shallower position than the lower surface of the oxide semiconductor layer.

4. The oxide semiconductor device according to claim 1, wherein
the dielectric layer is formed to cover an entire side surface of the oxide semiconductor layer.

5. The oxide semiconductor device according to claim 1, wherein
the oxide semiconductor layer is formed from the upper surface of the gallium oxide epitaxial layer to the inside of the gallium oxide epitaxial layer, and
the hetero pn junction is formed between the lower surface of the oxide semiconductor layer and the gallium oxide epitaxial layer.

6. The oxide semiconductor device according to claim 1, wherein
the oxide semiconductor layer is formed from the upper surface of the gallium oxide epitaxial layer to a lower surface of the gallium oxide epitaxial layer, and
the hetero pn junction is formed between the lower surface of the oxide semiconductor layer and the gallium oxide substrate.

7. The oxide semiconductor device according to claim 1, wherein
an impurity concentration in the gallium oxide epitaxial layer is lower than an impurity concentration in the gallium oxide substrate.

8. The oxide semiconductor device according to claim 1, wherein
the oxide semiconductor layer is a metal oxide that contains Cu or Ni.

9. A method of manufacturing an oxide semiconductor device, comprising:
forming a cathode electrode on a lower surface of an n-type gallium oxide substrate, the cathode electrode forming an ohmic junction with the gallium oxide substrate;
epitaxially growing an n-type gallium oxide epitaxial layer on an upper surface of the gallium oxide substrate;
forming a groove from an upper surface of the gallium oxide epitaxial layer to at least an inside of the gallium oxide epitaxial layer;
forming a dielectric layer on at least part of a side surface of the groove;
forming a p-type oxide semiconductor layer in the groove in which the dielectric layer has been formed on the side surface, the p-type oxide semiconductor layer being an oxide that is a different material from a material for the gallium oxide epitaxial layer and being made of a material having a higher dielectric constant than the dielectric layer;
forming an anode electrode on the upper surface of the gallium oxide epitaxial layer, the anode electrode forming a Schottky junction with the gallium oxide epitaxial layer; and
forming a hetero pn junction between a lower surface of the oxide semiconductor layer and the gallium oxide substrate or between the lower surface of the oxide semiconductor layer and the gallium oxide epitaxial layer.

10. The method of manufacturing an oxide semiconductor device according to claim 9, wherein
the oxide semiconductor layer is formed at a temperature less than or equal to 200° C.

11. The method of manufacturing an oxide semiconductor device according to claim 9, wherein
the groove is formed from the upper surface of the gallium oxide epitaxial layer to the inside of the gallium oxide epitaxial layer, and
the hetero pn junction is formed between the lower surface of the oxide semiconductor layer and the gallium oxide epitaxial layer.

12. The method of manufacturing an oxide semiconductor device according to claim 9, wherein
the groove is formed from the upper surface of the gallium oxide epitaxial layer to a lower surface of the gallium oxide epitaxial layer, and
the hetero pn junction is formed between the lower surface of the oxide semiconductor layer and the gallium oxide substrate.

13. A method of manufacturing an oxide semiconductor device, comprising:
forming a cathode electrode on a lower surface of an n-type gallium oxide substrate, the cathode electrode forming an ohmic junction with the gallium oxide substrate;
epitaxially growing an n-type first gallium oxide epitaxial layer on an upper surface of the gallium oxide substrate;
forming a p-type oxide semiconductor layer on part of an upper surface of the first gallium oxide epitaxial layer, the p-type oxide semiconductor layer being made of an oxide that is a different material from a material for the first gallium oxide epitaxial layer;
forming a dielectric layer on at least part of a side surface of the oxide semiconductor layer, the dielectric layer being made of a material having a lower dielectric constant than the material for the oxide semiconductor layer;
epitaxially growing an n-type second gallium oxide epitaxial layer to cover the first gallium oxide epitaxial layer, the oxide semiconductor layer, and the dielectric layer;
forming an anode electrode on the upper surface of the second gallium oxide epitaxial layer, the anode electrode forming a Schottky junction with the second gallium oxide epitaxial layer; and
forming a hetero pn junction between a lower surface of the oxide semiconductor layer and the upper surface of the first gallium oxide epitaxial layer.

* * * * *